(12) United States Patent
Chiu et al.

(10) Patent No.: US 11,841,584 B2
(45) Date of Patent: Dec. 12, 2023

(54) LIGHT-EMITTING MODULE AND ELECTRONIC DEVICE

(71) Applicant: Innolux Corporation, Miao-Li County (TW)

(72) Inventors: Yujun Chiu, Tainan (TW); Lavender Cheng, Tainan (TW); Maggy Hsu, Tainan (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 18/148,557

(22) Filed: Dec. 30, 2022

(65) Prior Publication Data

US 2023/0138997 A1    May 4, 2023

Related U.S. Application Data

(63) Continuation of application No. 17/517,400, filed on Nov. 2, 2021, now Pat. No. 11,561,434.

(51) Int. Cl.

| | | |
|---|---|---|
| *G02F 1/13357* | (2006.01) |
| *H01L 25/075* | (2006.01) |
| *H01L 33/50* | (2010.01) |
| *H01L 33/58* | (2010.01) |
| *H01L 33/62* | (2010.01) |
| *H01L 33/60* | (2010.01) |

(52) U.S. Cl.
CPC .. *G02F 1/133611* (2013.01); *G02F 1/133603* (2013.01); *G02F 1/133606* (2013.01); *H01L 25/0753* (2013.01); *H01L 33/507* (2013.01); *H01L 33/58* (2013.01); *H01L 33/60* (2013.01); *H01L 33/62* (2013.01); *H01L 2933/0091* (2013.01)

(58) Field of Classification Search
CPC ......... G02F 1/133603; G02F 1/133606; G02F 1/133614
See application file for complete search history.

(56) References Cited

U.S. PATENT DOCUMENTS

| | | | | |
|---|---|---|---|---|
| 2011/0096265 | A1* | 4/2011 | Murakoshi | G02F 1/133605 349/64 |
| 2016/0004123 | A1* | 1/2016 | Tanabe | G02F 1/133611 362/97.3 |
| 2016/0161089 | A1* | 6/2016 | Jeon | G02F 1/133603 349/64 |
| 2018/0356685 | A1* | 12/2018 | Jang | G02F 1/133603 |
| 2022/0146881 | A1* | 5/2022 | Cong | G02F 1/133605 |

* cited by examiner

*Primary Examiner* — Andrew J Coughlin
(74) *Attorney, Agent, or Firm* — Patterson + Sheridan, LLP

(57) ABSTRACT

A light-emitting module is provided. The light-emitting module includes a circuit substrate and a first light-emitting element disposed on the circuit substrate. The light-emitting module also includes an optical pattern disposed on the circuit substrate and adjacent to the first light-emitting element. The light-emitting module further includes a lens covering the first light-emitting element and the optical pattern.

13 Claims, 11 Drawing Sheets

LIGHT-EMITTING MODULE AND ELECTRONIC DEVICE

CROSS REFERENCE TO RELATED APPLICATIONS

This application is a Continuation of application Ser. No. 17/517,400, filed Nov. 2, 2021, the entirety of which is incorporated by reference herein.

BACKGROUND

Field of the Disclosure

The present disclosure relates to a light-emitting module and an electronic device, and in particular to a light-emitting module and an electronic device including a lens that covers the light-emitting element and the optical pattern.

Description of the Related Art

The light-emitting module has been used in the electronic devices. In present light-emitting modules, visual mura may occur due to the bright difference between adjacent light-emitting elements. Accordingly, how to reduce the bright difference between adjacent light-emitting elements is an important issue.

BRIEF SUMMARY

In some embodiments of the disclosure provide a light-emitting module, the light-emitting module includes a circuit substrate and a first light-emitting element disposed on the circuit substrate. The light-emitting module includes an optical pattern disposed on the circuit substrate and adjacent to the first light-emitting element. The light-emitting module includes a lens covering the first light-emitting element and the optical pattern.

In some embodiments of the disclosure provide an electronic device, the electronic device comprises a light-emitting module. The light-emitting module includes a circuit substrate and a first light-emitting element disposed on the circuit substrate. The light-emitting module includes an optical pattern disposed on the circuit substrate and adjacent to the first light-emitting element. The light-emitting module includes a lens covering the first light-emitting element and the optical pattern.

BRIEF DESCRIPTION OF THE DRAWINGS

The present disclosure can be more fully understood by reading the subsequent detailed description and examples with references made to the accompanying drawings.

DETAILED DESCRIPTION

Figure 1:
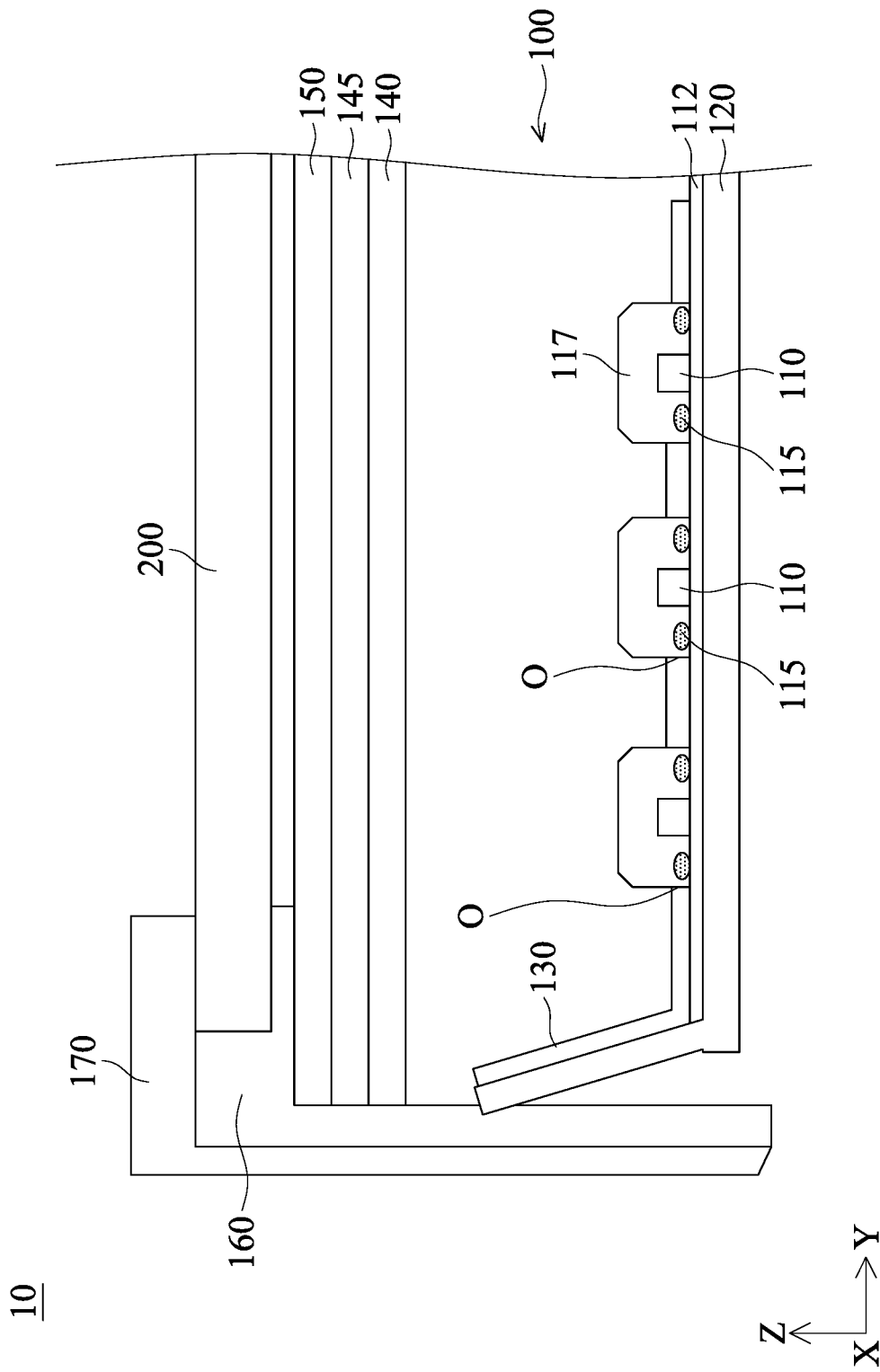
FIG. 1 is a cross-sectional view illustrating an electronic device in accordance with some embodiments of the present disclosure.

The present disclosure may be understood by referring to the following description and the appended drawings. In addition, the number and the size of each component in the drawings merely serves as an example, and are not intended to limit the scope of the present disclosure. Furthermore, similar and/or corresponding numerals may be used in different embodiments for describing some embodiments simply and clearly, but not represent any relationship between different embodiment and/or structures discussed below.

Certain terms may be used throughout the present disclosure and the appended claims to refer to particular elements. Those skilled in the art will understand that electronic device manufacturers may refer to the same components by different names. The present specification is not intended to distinguish between components that have the same function but different names. In the following specification and claims, the words "including", "comprising", "having" and the like are open words, so they should be interpreted as meaning "including but not limited to . . . ". Therefore, when terms "including", "comprising", and/or "having" are used in the description of the disclosure, the presence of corresponding features, regions, steps, operations and/or components is specified without excluding the presence of one or more other features, regions, steps, operations and/or components.

In addition, in this specification, relative expressions may be used. For example, "lower", "bottom", "higher" or "top" are used to describe the position of one element relative to another. It should be noted that if a device is flipped upside down, an element that is "lower" will become an element that is "higher".

When a corresponding component (such as a film layer or region) is referred to as "on another component", it may be directly on another component, or there may be other components in between. On the other hand, when a component is referred "directly on another component", there is no component between the former two. In addition, when a component is referred "on another component", the two components have an up-down relationship in the top view, and this component can be above or below the other component, and this up-down relationship depends on the orientation of the device.

The terms "about" or "substantially" are generally interpreted as within 20% of a given value or range, or as interpreted as within 10%, 5%, 3%, 2%, 1%, or 0.5% of a given value or range.

It should be understood that, although the terms "first", "second" etc. may be used herein to describe various elements, regions, layers and/or portions, and these elements, regions, layers, and/or portions should not be limited by these terms. These terms are only used to distinguish one element, component, region, layer, or portion. Thus, a first element, component, region, layer or portion discussed below could be termed a second element, component, region, layer or portion without departing from the teachings of some embodiments of the present disclosure. In addition, for the sake of brevity, terms such as "first" and "second" may not be used in the description to distinguish different elements. As long as it does not depart from the scope defined by the appended claims, the first element and/or the second element described in the appended claims can be interpreted as any element that meets the description in the specification.

In the present disclosure, the thickness, length, and width can be measured by using an optical microscope, and the thickness can be measured by the cross-sectional image in the electron microscope, but it is not limited thereto. In addition, a certain error may be present in a comparison with any two values or directions. If the first value is equal to or same with the second value, it implies that an error of about 10% between the first value and the second value may be present. If the first direction is perpendicular to the second direction, the angle between the first direction and the second direction may be between 80 degrees and 100 degrees. If the first direction is parallel to the second direction, the angle between the first direction and the second direction may be between 0 degrees and 10 degrees.

It should be noted that the technical solutions provided by different embodiments below may be interchangeable, combined or mixed to form another embodiment without departing from the spirit of the present disclosure.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure. It should be noted that the description "a first feature is/may be disposed on a second feature" herein may include embodiments in which the first feature and the second feature are disposed in direct contact, and may also include embodiments in which additional features may be disposed between the first feature and the second feature, such that the first feature and the second feature may not be in direct contact.

FIG. 1 is a cross-sectional view illustrating an electronic device 10 in accordance with some embodiments of the present disclosure. It should be noted that the electronic device 10 may include a display device, an antenna device, a sensing device, a touch device, or a combination thereof.

Figure 2:
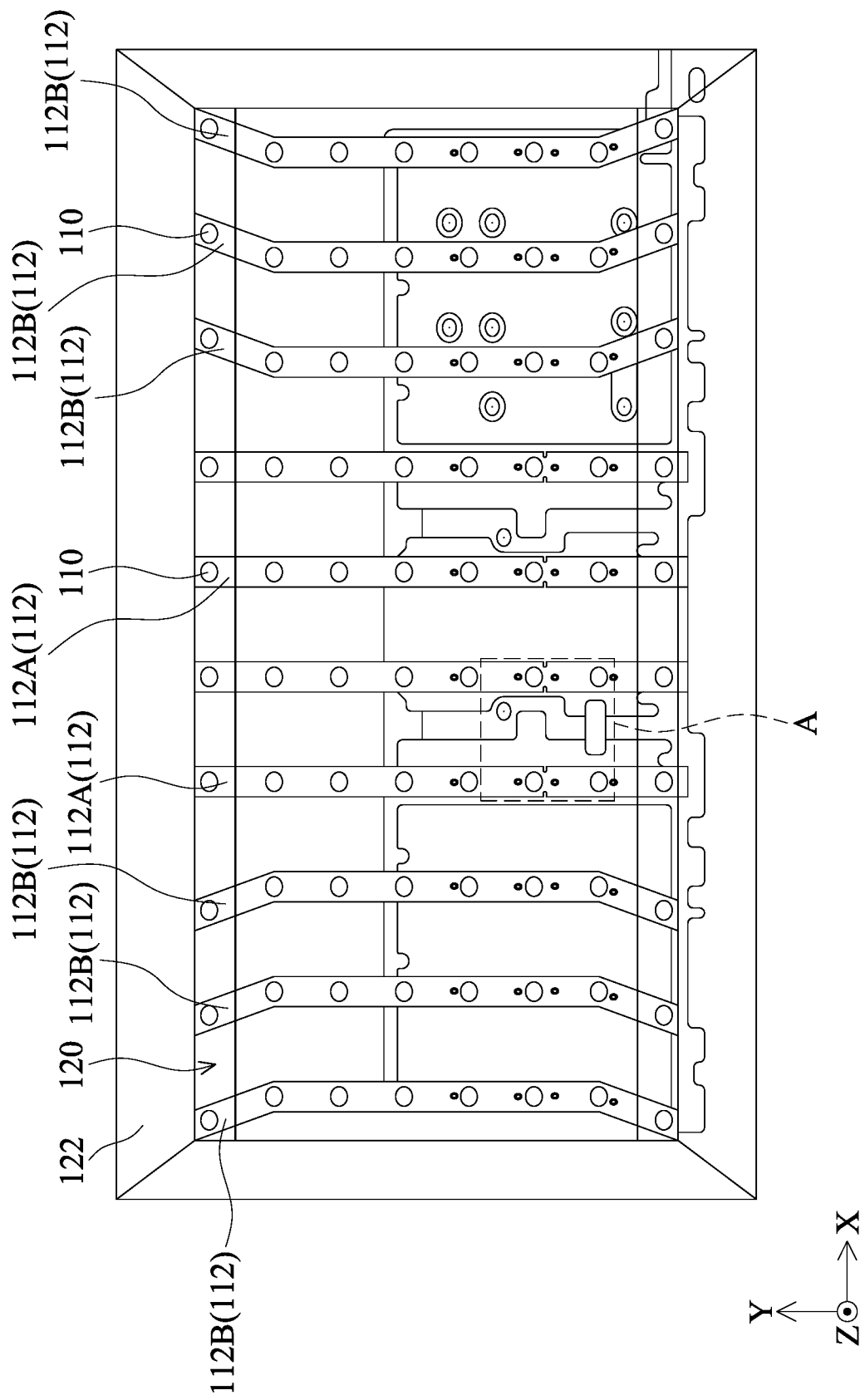
FIG. 2 is a top view illustrating a light-emitting module in accordance with some embodiments of the present disclosure.

FIG. 2 is a top view illustrating the light-emitting module in accordance with some embodiments of the present disclosure. It is noted that the light-emitting module shown in the present embodiment may include the same or similar elements and/or portions as the light-emitting module 100 shown in FIG. 1. The electronic device may include a bendable, a curved or flexible electronic device or a combination thereof, but is not limited thereto. The electronic device 10 may include light-emitting element 110, the light-emitting element 110 may include light-emitting diode, fluorescence, phosphor, quantum dot (QD), other suitable electronic media, or a combination thereof, but is not limited thereto. The light-emitting diode may include organic light-emitting diode (OLED), inorganic light-emitting diode, mini LED, micro LED or quantum dot (QD) light-emitting diode (which may be referred to as QLED, QDLED), other suitable materials or a combination thereof, and these materials can be arranged and combined arbitrarily, but it is not limited thereto. The antenna device may include a liquid-crystal antenna, but it is not limited thereto. In some embodiments, the shape of the electronic device may be rectangle, circle, polygon, a curve-edged shape, or any other suitable shape.

As shown in FIG. 1 and FIG. 2, the electronic device 10 may include a light-emitting module 100 and a panel 200 disposed on the light-emitting module 100. In the present embodiment, the light-emitting module 100 may include a circuit substrate 112 and a plurality of light-emitting elements 110 disposed on the circuit substrate 112. In some embodiments, the circuit substrate 112 may include a flexible circuit board or a rigid circuit board, but it is not limited thereto. In other word, the circuit substrate 112 may include a substrate (not shown) and a circuit element (such as active component, passive component and/or wire) disposed on the substrate.

In some embodiments (FIG. 2), the circuit substrates 112 may include a plurality of sub-circuit substrates 112 (such as the sub-circuit substrates 112A and/or the sub-circuit substrates 112B). The circuit substrate 112 (including the sub-circuit substrates 112A and/or the sub-circuit substrates 112B) may electrically connect the plurality of light-emitting elements 110.

In some embodiments, a plurality of light-emitting elements 110 and a plurality of optical patterns 115 may be disposed on the circuit substrate 112. In some embodiments, one of the plurality of optical patterns 115 may be adjacent to one of the plurality of light-emitting elements 110. In some embodiments, a plurality of lenses 117 may be disposed on the circuit substrate 112, and one of the plurality of lenses 117 may cover one of the light-emitting element 110 and one of the optical patterns 115. In some embodiments, the lens 117 may be an optical element, and the optical element may change the optical path of an incident light. The lens 117 may include convex lens or concave lens, but it is not limited. The term "A element covers B element" means that the A element is disposed on the B element and overlaps the B element in a normal direction of a surface of the circuit substrate 112. In some embodiments, the light-emitting elements 110 may be configured to emit a blue light, and the optical patterns 115 may include a wavelength conversion material. In some embodiments, the optical pattern may include fluorescence, phosphorescence or quantum dots, but it is not limited thereto. For example, the optical patterns 115 may be yellow patterns (such as yellow fluorescence, yellow phosphorescence or yellow quantum dots) or other suitable color patterns, but it is not limited thereto. In some other embodiments, the light-emitting elements 110 may be configured to emit the light of any color, and the optical patterns 115 may include another wavelength conversion material with different colors. Through the above design, the color band (such as blue band) around or adjacent to the light-emitting elements may be reduced, or the brightness among different light-emitting elements may be more uniform.

As shown in FIG. 1, in some embodiments, the light-emitting module 100 may include a backplate 120, a reflection element 130, a diffuser 140, a color conversion layer 145, and/or at least one optical film 150, but it is not limited thereto. The circuit substrate 112 may be disposed in the backplate 120. The reflection element 130 may be disposed in the backplate 120. In some embodiments, the reflection element 130 may include a plurality of openings O exposing part of the circuit substrate 112, and the light-emitting elements 110 may disposed on the part of the circuit substrate 112, but it is not limited thereto.

In some embodiments, the diffuser 140 may be disposed on the backplate 120 and the light-emitting elements 110. In some embodiments, the color conversion layer 145 may be disposed on the diffuser 140, but it is not limited thereto. In some embodiments, the color conversion layer 145 may include phosphor, quantum dot, fluorescence, any other suitable material or a combination thereof, but it is not limited thereto. In some embodiments, the at least one optical film 150 may be disposed on the diffuser 140 for optimizing the emitted light. It should be noted that, although the single-layered optical film 150 is shown, those skilled in the art may adopt multiple optical films as required. In some embodiments, the at least one optical film 150 may include a bright enhancement film, and/or a light recycle film. In some embodiments, the number and/or arrangement of the above layers or films may depend on the needs. The light-emitting elements 110 may be configured to emit light, and at least a portion of the emitted light may be reflected to the diffuser 140 and/or the optical film 150 through the reflection element 130, but it is not limited thereto.

In some embodiments, the panel 200 may be disposed on the light-emitting module 100. The panel 200 may include a first substrate, a second substrate and a liquid crystal layer (not separately illustrated) disposed between the first substrate and the second substrate, but it is not limited thereto.

In some embodiments, the display device 10 may further include a frame 170 and/or a housing 160. A portion of the housing 160 may be disposed between the light-emitting module 100 and the panel 200, and the housing 160 may be configured to support the panel 200. The frame 170 may be disposed outside the light-emitting module 100 and/or the panel 200. In some embodiments, the frame 170 may be optionally disposed to protect the elements in the light-emitting module 100.

As shown in FIG. 2, the circuit substrates 112 may include a plurality of sub-circuit substrates 112A extend along a second direction Y. In some embodiments, the circuit substrates 112 may include a plurality of sub-circuit substrates 112B that are different from the sub-circuit substrates 112A. In some embodiments, the light-emitting elements 110 may be disposed on the sub-circuit substrates 112A, and the light-emitting elements may be arranged along the second direction Y. In some embodiments, the light-emitting elements 110 may be disposed on the sub-circuit substrates 112B, and a part of the light-emitting elements 110 may be arranged along the second direction Y, and a part of the light-emitting elements 110 do not be arranged along the second direction Y. In some embodiments, the sub-circuit substrates 112A may be in a rectangular shape, and the sub-circuit substrates 112B may not be in a rectangular shape, but it is not limited thereto.

Figure 3:
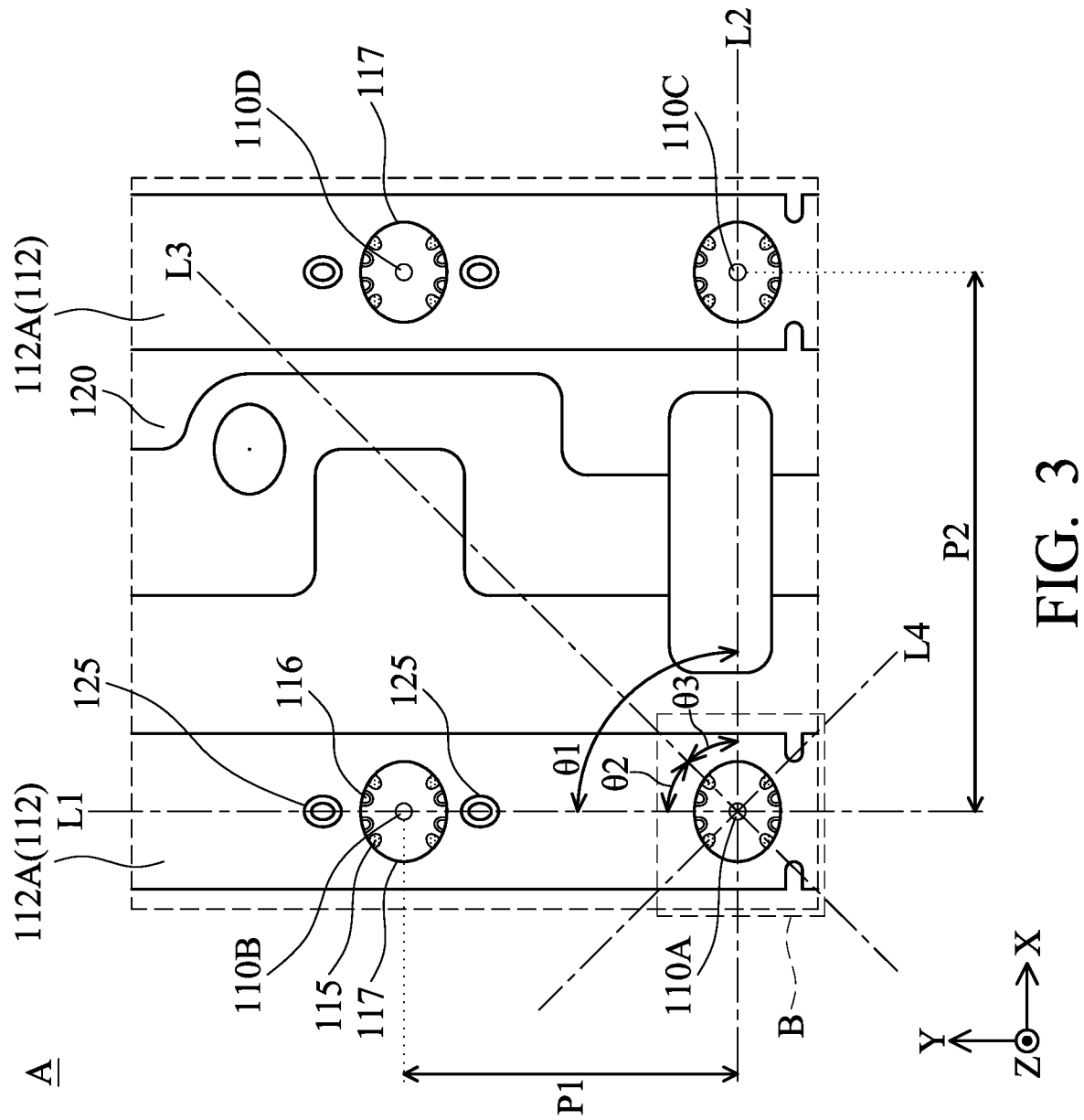
FIG. 3 is an enlarged top view illustrating the region A shown in FIG. 2 in accordance with some embodiments of the present disclosure.

FIG. 3 is an enlarged top view illustrating the region A shown in FIG. 2 in accordance with some embodiments of the present disclosure. In the present embodiment, four light-emitting elements (such as a first light-emitting element 110A, a second light-emitting element 110B, a third light-emitting element 110C, and a fourth light-emitting element 110D) are shown in the region A.

In some embodiments, the light-emitting elements 110 may include the first light-emitting element 110A, the second light-emitting element 110B, the third light-emitting element 110C, and the fourth light-emitting element 110D that are disposed on the circuit substrate 112. The first light-emitting element 110A and the second light-emitting element 100B may be arranged along a first virtual line L1 and separated by a first pitch P1, the first light-emitting element 110A and the third light-emitting element 110C are arranged along a second virtual line L2 and separated by a second pitch P2. In other word, the first virtual line L1 may be illustrated by connecting the first light-emitting element 110A and the second light-emitting element 110B, and the second virtual line L2 may be illustrated by connecting the first light-emitting element 110A and the third light-emitting element 110C. In some embodiments, the first virtual line L1 may approximately pass through the centers of the first light-emitting element 110A and the second light-emitting element 110B, and the second virtual line L2 may approximately pass through the centers of the first light-emitting element 110A and the third light-emitting element 110C, but it is not limited thereto. In some embodiments, the first virtual line L1 may be substantially tangent to the same side of the first light-emitting element 110A and the second light-emitting element 110B, and the second virtual line L2 may be substantially tangent to the same side of the first light-emitting element 110A and the third light-emitting element 110C.

In addition, a first pitch P1 may be defined by a pitch between the first light-emitting element 110A and the second light-emitting element 110B, and a second pitch P2 may be defined as a pitch between the first light-emitting element 110A and the third light-emitting element 110C. For example, the first pitch P1 may be measured from a center of the first light-emitting element 110A to a center of the second light-emitting element 110B, but it is not limited thereto. In some embodiments, the first pitch P1 may be measured between the same sides (such as the right side or the left side) of the first light-emitting element 110A and the second light-emitting element 110B. For example, the second pitch P2 may be measured from the center of the first light-emitting element 110A to the center of the third light-emitting element 110C, but it is not limited thereto. In some embodiments, second pitch P2 may be measured between the same sides (such as the right side or the left side) of the first light-emitting element 110A and the third light-emitting element 110C. In some embodiments, the first pitch P1 may be different from the second pitch P2.

Figure 4:
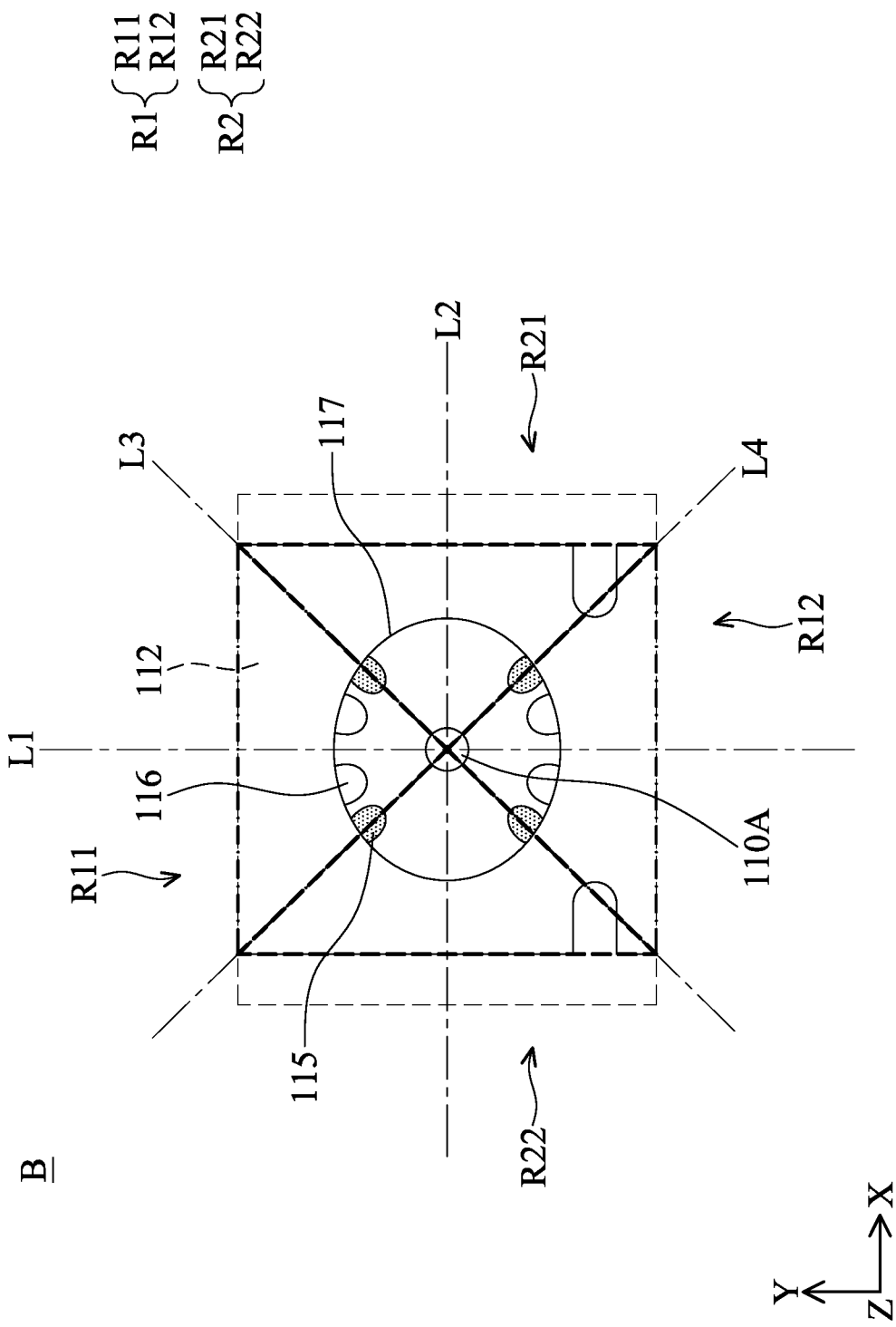
FIG. 4 is an enlarged top view illustrating the region B shown in FIG. 3 in accordance with some embodiments of the present disclosure.

In some embodiments, a first angle θ1 may be between the first virtual line L1 and the second virtual line L2, and the first angle θ1 may be greater than 0 degree, a second angle θ2 may be between a third virtual line L3 and the first virtual line L1, a third angle θ3 may be between a third virtual line L3 and the second virtual line L2, the second angle θ2 and the third angle θ3 are half of the first angle θ1, a fourth virtual line L4 is perpendicular to the third virtual line L3. As shown in FIG. 4, in some embodiments, when the light-emitting elements arrange in an array type, the first virtual line L1 may be perpendicular to the second virtual line L2, and the first angle θ1 may be 90 degrees, but it is not limited thereto. The statement "the light-emitting elements arrange in an array type" means that the light-emitting elements may be arranged along the first direction X and the second direction Y, and the first direction X may be perpendicular to the second direction Y.

In other embodiments, when the light-emitting elements do not arrange in an array type (such as pentile type or other suitable type), the first virtual line L1 may be not perpendicular to the second virtual line L2, and the first angle θ1 may not be 90 degrees, such as 30 degrees, 45 degrees, 60 degrees or other suitable degrees.

In detail, when the light-emitting elements do not arrange in an array type, the first light-emitting element 110A, the second light-emitting element 110B and the third light-emitting element 110C can be selected as follows. First, we can select adjacent ones of the light-emitting elements as the first light-emitting element 110A and the second light-emitting element 110B. Then we can select other light-emitting element closest to the first light-emitting element 110A as the third light-emitting element 110C, and the other light-emitting element excludes the second light-emitting element 110B. The first light-emitting element 110A and the second light-emitting element 110B may be arranged along a direction, and the first light-emitting element 110A and the third light-emitting element 110C may be arranged along another direction that is different from the direction. When the first light-emitting element 110A, the second light-emitting element 110B and the third light-emitting element 110BC are selected, the first virtual line L1, the second virtual line L2, the third virtual line L3 and the fourth virtual line L4 can be obtained by the above manner. The first angle θ1 between the first virtual line L1 and the second virtual line L2 may be greater than 0 degree, and the first angle θ1 may not be 90 degrees. The first light-emitting element 110A and the second light-emitting element 100B may be arranged along a first virtual line L1 and separated by a first pitch P1, the first light-emitting element 110A and the third light-emitting element 110C are arranged along a second virtual line L2 and separated by a second pitch P2.

FIG. 4 is an enlarged top view illustrating the region B shown in FIG. 3 in accordance with some embodiments of the present disclosure. As shown in FIG. 4, the circuit substrate 112 may have a first region R1 and the second region R2, wherein the first virtual line L1 and the second virtual line L2 may define the first region R1 and the second region R2. The second region R2 may include a first sub-region R21 and a second sub-region R22, and the first region R1 may include a third sub-region R11 and a fourth sub-region R12. In detail, the third virtual line L3 and the fourth virtual line L4 may cross to define the first sub-region R21 of the second region R2, the second sub-region R22 of the second region R2, the third sub-region R11 of the first region R1 and the fourth sub-region R1 of the first region R1. The first virtual line L1 may pass through the first region R1, and the second virtual line L2 may pass through the second region R2, so that the first virtual line L1 and the second virtual line L2 may define the first region R1 and the second region R2. The first sub-region R21 and the second sub-region R22 may be located on two opposite sides of the light-emitting element 110A, and the second virtual line L2 may pass through the first sub-region R21 and the second sub-region R22. The third sub-region R11 and the forth sub-region R12 may be located on two opposite sides of the light-emitting element 110A, the first virtual line L1 may pass through the third sub-region R11 and the forth sub-region R12.

As shown in FIG. 3 and FIG. 4, in some embodiments, the optical pattern 115 may have a first total area AX located in the first region R1, a second total area AY located in the second region R2. In some embodiments, the first total area AX may be different from the second total area AY. In some embodiments, the first pitch P1, the second pitch P2, the first total area Ax and the second total area Ay may satisfy the following relation: P1<P2, and AX>AY, but it is not limited thereto. In some embodiments, the first pitch P1, the second pitch P2, the first total area AX and the second total area AY may satisfy the following relation: $0<P1/P2<1$, and $1<AX/AY\leq20$, but it is not limited thereto. In some embodiments, the first pitch P1, the second pitch P2, the first total area AX and the second total area AY may satisfy the following relation: $0<P1/P2<1$, and $2<AX/AY\leq18$. In some embodiments, the first pitch P1, the second pitch P2, the first total area AX and the second total area AY may satisfy the following relation: $0<P1/P2<1$, and $4<AX/AY\leq16$. Through the above design, the color band (such as blue band) around the light-emitting elements may be reduced, or the brightness among different light-emitting elements may be more uniform.

In other embodiments (not shown), the first pitch P1, the second pitch P2, the first total area AX and the second total area AY may satisfy the following relation: P1>P2, and AX<AY, but it is not limited thereto. In some embodiments, the first pitch P1, the second pitch P2, the first total area AX and the second total area AY may satisfy the following relation: $1<P1/P2\leq6$, and $0<AX/AY\leq0.5$, but it is not limited thereto. In some embodiments, the first pitch P1, the second pitch P2, the first total area AX and the second total area AY may satisfy the following relation: $1<P1/P2\leq6$, and $0.05<AX/AY\leq0.45$. In some embodiments, the first pitch P1, the second pitch P2, the first total area AX and the second total area AY may satisfy the following relation: $1<P1/P2\leq6$, and $0.1\leq AX/AY\leq0.4$. Through the above design, the color band (such as blue band) around the light-emitting elements may be reduced, or the brightness among different light-emitting elements may be more uniform.

In some embodiments, the optical pattern 115 may have a first area A1 located in the first sub-region R21 and a second area A2 located in the second sub-region R22, the second total area AY may be a sum of the first area A1 and the second area A2. In some embodiments, the optical pattern 115 may have a third area A3 located in the third sub-region R11 and a fourth area A4 located in the fourth sub-region R12, and the first total area AX may be a sum of the third area A3 and the fourth area A4.

In some embodiments, the first area A1 and the second area A2 may satisfy the following relation: $0.6\leq A1/A2\leq1.4$, but it is not limited thereto. In some embodiments, the first area A1 and the second area A2 may satisfy the following relation: $0.7\leq A1/A2\leq1.3$. In some embodiments, the first area A1 and the second area A2 may satisfy the following relation: $0.8\leq A1/A2\leq1.2$. Through the above design, the brightness among different light-emitting elements may be more uniform.

In some embodiments, the third area A3 and the fourth area A4 may satisfy the following relation: $0.6\leq A3/A4\leq1.4$. In some embodiments, the third area A3 and the fourth area A4 may satisfy the following relation: $0.7\leq A3/A4\leq1.3$. In some embodiments, the third area A3 and the fourth area A4 may satisfy the following relation: $0.8\leq A3/A4\leq1.2$. Through the above design, the brightness among different light-emitting elements may be more uniform.

In addition, the light-emitting module 100 may include an adhesive 116, and the adhesives 116 may be disposed on the circuit substrate 112. In some embodiments, the adhesive 116 may be disposed adjacent to the optical pattern 115, and the adhesive 116 may be configured to bond the lens 117 onto the circuit substrate 112.

In some embodiments, the adhesive 116 may be located in the first region R1 and/or the second region R2, but it is not limited thereto. In some embodiments (shown in FIG. 4), the adhesive 116 may be located in the second region R2, and the adhesive 116 may be located in first sub-region R21 and/or the second sub-region R22, but it is not limited thereto. In some embodiments, the adhesive 116 may be symmetrically distributed in the first sub-region R21 and the second sub-region R22, but it is not limited thereto. In other embodiments (not shown), the adhesive 116 may be located in the first region R1, and the adhesive 116 may be located in the third sub-region R11 and/or the fourth sub-region R12, but it is not limited thereto. In some embodiments, the adhesive 116 may be symmetrically distributed in the third sub-region R11 and the fourth sub-region R12, but it is not limited thereto.

Figure 5:
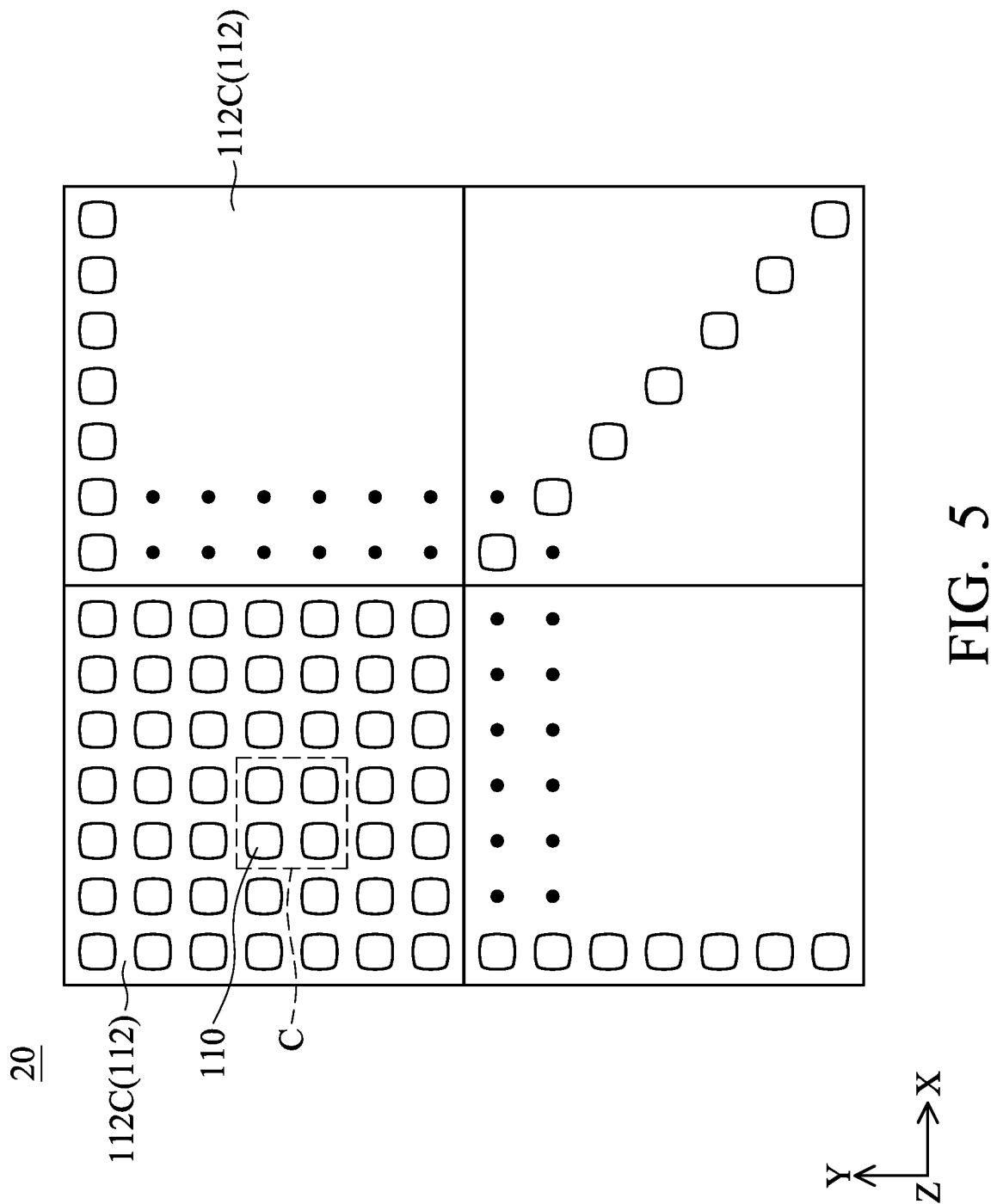
FIG. 5 is a top view illustrating the light-emitting module in accordance with some embodiments of the present disclosure.

FIG. 5 is a top view illustrating the electronic device 20 in accordance with some embodiments of the present disclosure. It is noted that, the electronic device 20 shown in the present embodiment may include the same or similar elements and/or portions as the electronic device 10 shown in FIG. 1. These elements and/or portions will be denoted as the same numerals and will not be discussed in detail again. As shown in FIG. 5, the electronic device 20 may include the circuit substrate 112, the circuit substrate 112 may include a plurality of sub-circuit substrates 112C, the plurality of sub-circuit substrates 112C are arranged along the first direction X and the second direction Y, the first direction X may be different from the second direction Y, but it is not limited thereto. In some embodiments, the first direction X may perpendicular to the second direction Y. In some embodiments, the light-emitting elements 110 are disposed on the sub-circuit substrates 112C of the circuit substrate 112. In some embodiments, a number of the light-emitting elements 110 disposed on the sub-circuit substrate 112C along the first direction X may be same as a number of the light-emitting elements 110 disposed on the sub-circuit substrate 112C along the second direction Y, but it is not limited thereto. In other embodiments, the number of the light-emitting elements 110 disposed on the sub-circuit substrate 112C along the first direction X may be different from the number of the light-emitting elements 110 disposed in the sub-circuit substrate 112C along the second direction Y.

Figure 6:
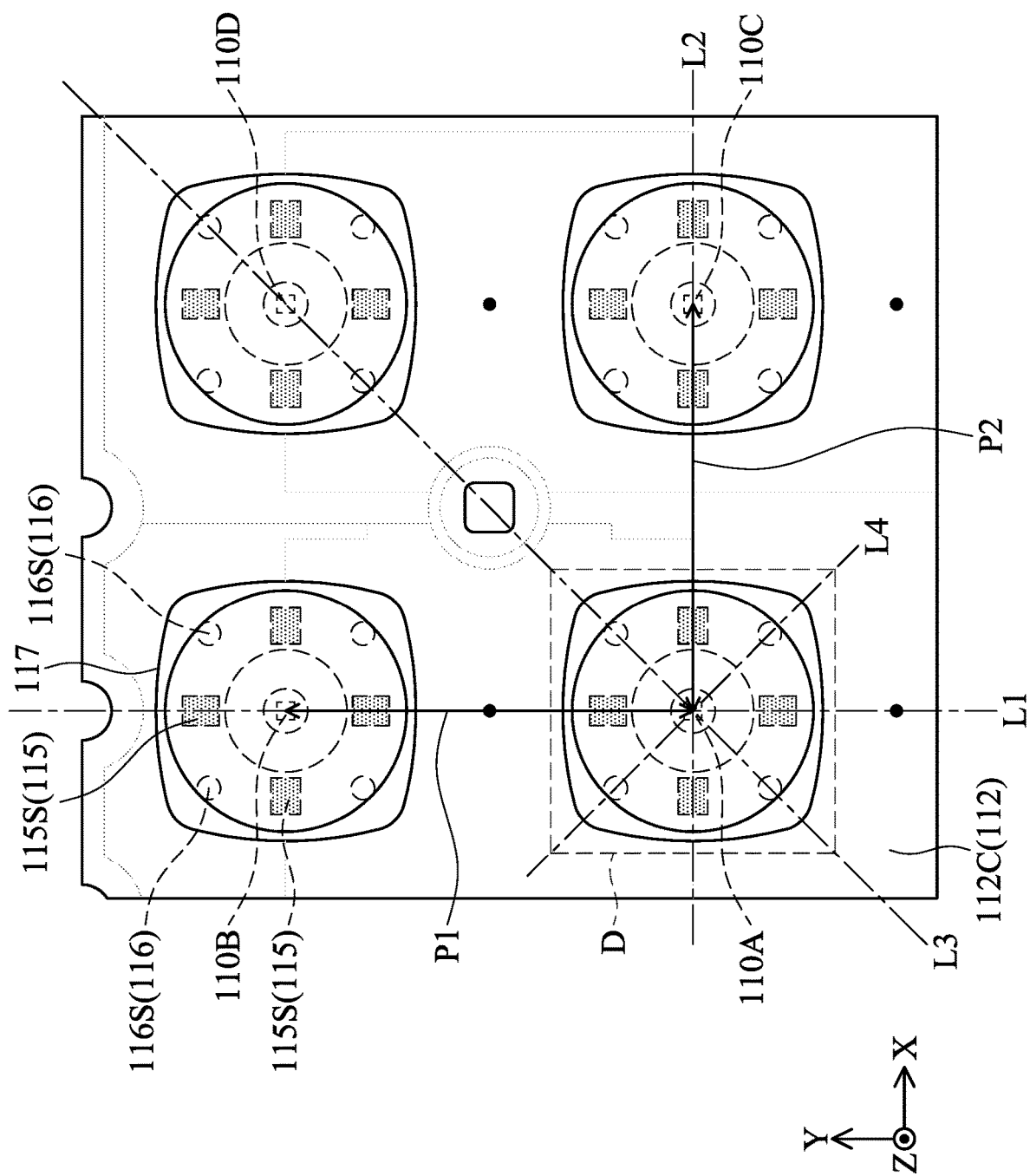
FIG. 6 is an enlarged top view illustrating the region C shown in FIG. 5 in accordance with some embodiments of the present disclosure.

FIG. 6 is an enlarged top view illustrating the region C shown in FIG. 5 in accordance with some embodiments of the present disclosure. It is noted that the light-emitting module shown in the present embodiment may include the same or similar elements and/or portions as the light-emitting module shown in FIG. 3. These elements and/or portions will be denoted as the same numerals and will not be discussed in detail again. As shown in FIG. 6, four light-emitting elements (such as the first light-emitting element 110A, the second light-emitting element 110B, the third light-emitting element 110C, and the fourth light-emitting element 110D) are shown in the region C. In some embodiments, the optical pattern 115 may be disposed on the circuit substrate 112 and adjacent to and/or around the light-emitting element (such as the first light-emitting element 110A, the second light-emitting element 110B, the third light-emitting element 110C, and the fourth light-emitting element 110D). In some embodiments, the lens 117 may cover the light-emitting element (such as the first light-emitting element 110A, the second light-emitting element 110B, the third light-emitting element 110C, and the fourth light-emitting element 110D) and the optical pattern 115. In some embodiments (for example, FIG. 6), the first virtual line L1, the second virtual line L2, the third virtual line L3, and the fourth virtual line L4 may be defined in the similar manner as discussed in FIG. 3, and therefore will not be described in detail again.

In addition, the light-emitting element 110A and the light-emitting element 110B may be arranged along the first virtual line L1 and separated by a first pitch P1, the light-emitting element 110A and the light-emitting element 110C may be arranged along a second virtual line L2 and separated by a second pitch P2.

In some embodiments (for example, FIG. 6), the first pitch P1 and the second pitch P2 may be defined in the similar manner as discussed in FIG. 3, and therefore will not be described in detail again.

Figure 7:
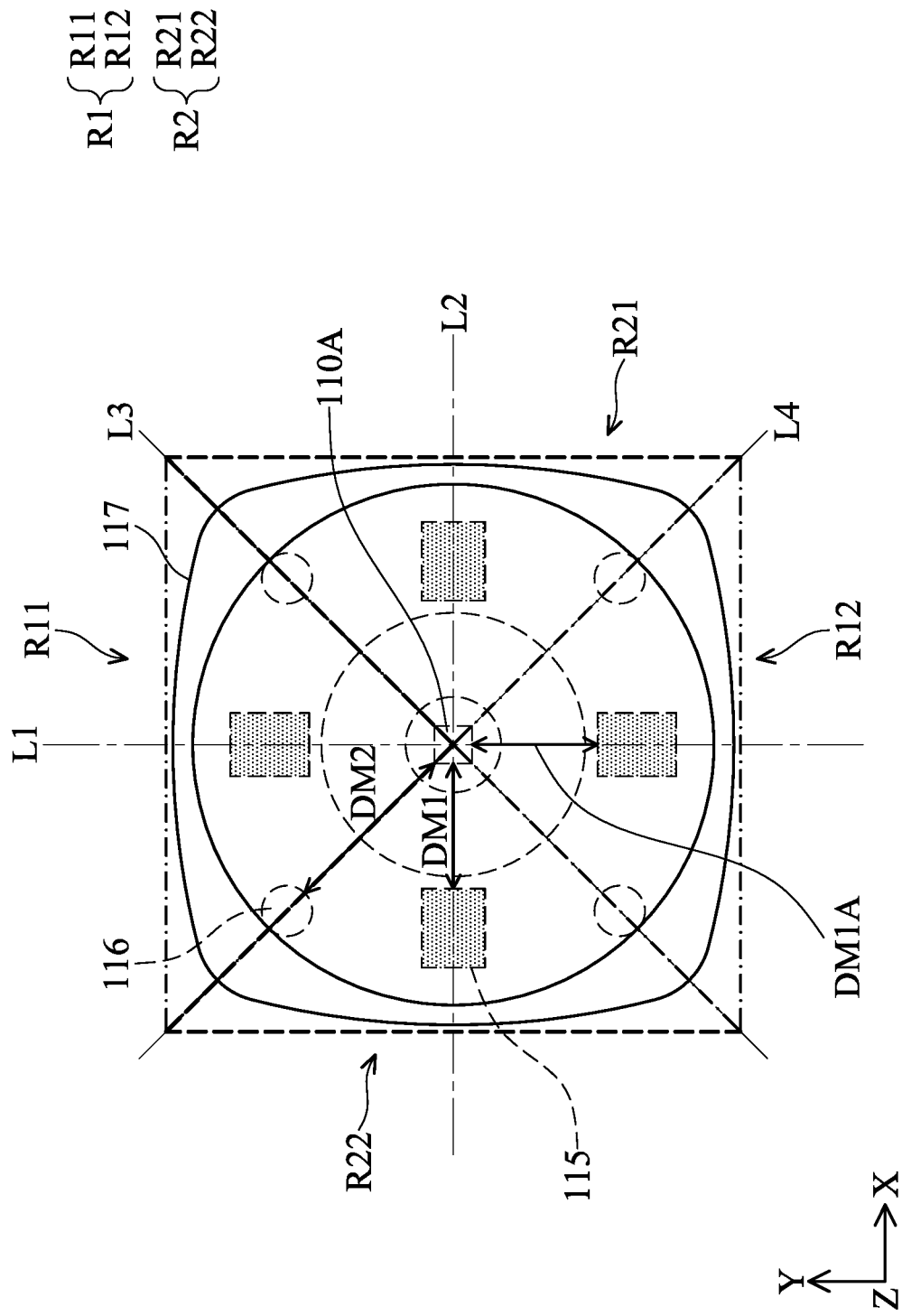
FIG. 7 is an enlarged top view illustrating the region D shown in FIG. 6 in accordance with some embodiments of the present disclosure.

FIG. 7 is an enlarged top view illustrating the region D shown in FIG. 6 in accordance with some embodiments of the present disclosure. As shown in FIG. 7, the first virtual line L1 and the second virtual line L2 may define a first region R1 and a second region R2, the optical pattern 150 may have a first total area AX located in the first region R1, and a second total area AY located in the second region R2. In some embodiments, the first region R1 may include a third sub-region R11 and a fourth sub-region R12. The third sub-region R11 and the fourth sub-region R12 may be located on two opposite sides of the light-emitting element 110A. In some embodiments, the optical pattern 115 may have a third area A3 located in the third sub-region R11 and a fourth area A4 located in the fourth sub-region R12, and the third area A3 and the fourth area A4 may satisfy the following relation: $0.6 \leq A3/A4 \leq 1.4$. In some embodiments, the third area A3 and the fourth area A4 may satisfy the following relation: $0.65 \leq A3/A4 \leq 1.35$. In some embodiments, the third area A3 and the fourth area A4 may satisfy the following relation: $0.7 \leq A3/A4 \leq 1.3$. In some embodiments, the third area A3 and the fourth area A4 may satisfy the following relation: $0.8 \leq A3/A4 \leq 1.2$. Through the above design, the brightness among different light-emitting elements may be more uniform.

As shown in FIG. 7 in some embodiments, a second region R2 may include a first sub-region R21 and a second sub-region R22. The first sub-region R21 and the second sub-region R22 may be located on two opposite sides of the light-emitting element 110A. In some embodiments, the optical pattern 115 may have a first area A1 located in the first sub-region R21 and a second area A2 located in the second sub-region R12, and the first area A1 and the second area A2 may satisfy the following relation: $0.6 \leq A1/A2 \leq 1.4$. In some embodiments, the first area A1 and the second area A2 may satisfy the following relation: $0.65 \leq A1/A2 \leq 1.35$. In some embodiments, the first area A1 and the second area A2 may satisfy the following relation: $0.7 \leq A1/A2 \leq 1.3$. In some embodiments, the first area A1 and the second area A2 may satisfy the following relation: $0.8 \leq A1/A2 \leq 1.2$. Through the above design, the brightness among different light-emitting elements may be more uniform.

In some embodiments, the optical pattern 115 may have a first total area AX located in the first region R1 and a second total area AY located in the second region R2, and the first total area AX may be substantially equal to the second total area AY. The first total area AX may be a sum of the third area A3 and the forth area A4. The second total area AY may be a sum of the first area A1 and the second area A2.

In some embodiments, the adhesive 116 may be adjacent to and/or around the light-emitting element. In some embodiments, the adhesive 116 does not overlap with the optical pattern 115 in the normal direction Z of the circuit board 112, but it is not limited thereto. In other embodiments (not shown), the adhesive 116 may overlap with a part of the optical pattern 115 in the normal direction Z of the circuit board 112. In some embodiments, the adhesive 116 may be located in the first region R1 and the second region R2, but it is not limited thereto. In some embodiments, the adhesive 116 may be symmetrically distributed in the first sub-region R21 and the second sub-region R22, but it is not limited thereto. In some embodiments, the optical pattern 115 may have a plurality of sub-patterns 115S, and/or the adhesive 116 may have a plurality of sub-patterns 116S. In some embodiments, the sub-patterns 115S and the sub-patterns 116S may be staggered with each other, but they are not limited thereto. In some embodiments, the profile of the sub-pattern 115S and the profile of the sub-pattern 116S may be different from each other. In some embodiments, a minimum distance DM1 between one of the sub-patterns 115S of the optical pattern 115 and the first light-emitting element 110A may be different from a minimum distance DM2 between one of the sub-patterns 116S of the adhesive 116 and the first light-emitting element 110A. In some embodiments, the minimum distance DM1 between one of the sub-patterns 115S of the optical pattern 115 and the first light-emitting element 110A may be less than the minimum distance DM2 between one of the sub-patterns 116S of the adhesive 116 and the first light-emitting element 110A. In other embodiments (not shown), on the X-Y plane, the minimum distance DM1 between one of the sub-patterns 115S of the optical pattern 115 and the first light-emitting element 110A may be greater than the minimum distance DM2 between one of the sub-patterns 116S of the adhesive 116 and the first light-emitting element 110A.

In some embodiments, on the X-Y plane, the minimum distance DM1 between one of the sub-patterns 115S of the optical pattern 115 and the first light-emitting element 110A may be same as a minimum distance DM1A between another one of the sub-patterns 116S of the adhesive 116 and the first light-emitting element 110A. In other embodiments (not shown), on the X-Y plane, the minimum distance DM1 between one of the sub-patterns 115S of the optical pattern 115 and the first light-emitting element 110A may be different from a minimum distance DM1A between another one of the sub-patterns 116S of the adhesive 116 and the first light-emitting element 110A.

Figure 8:
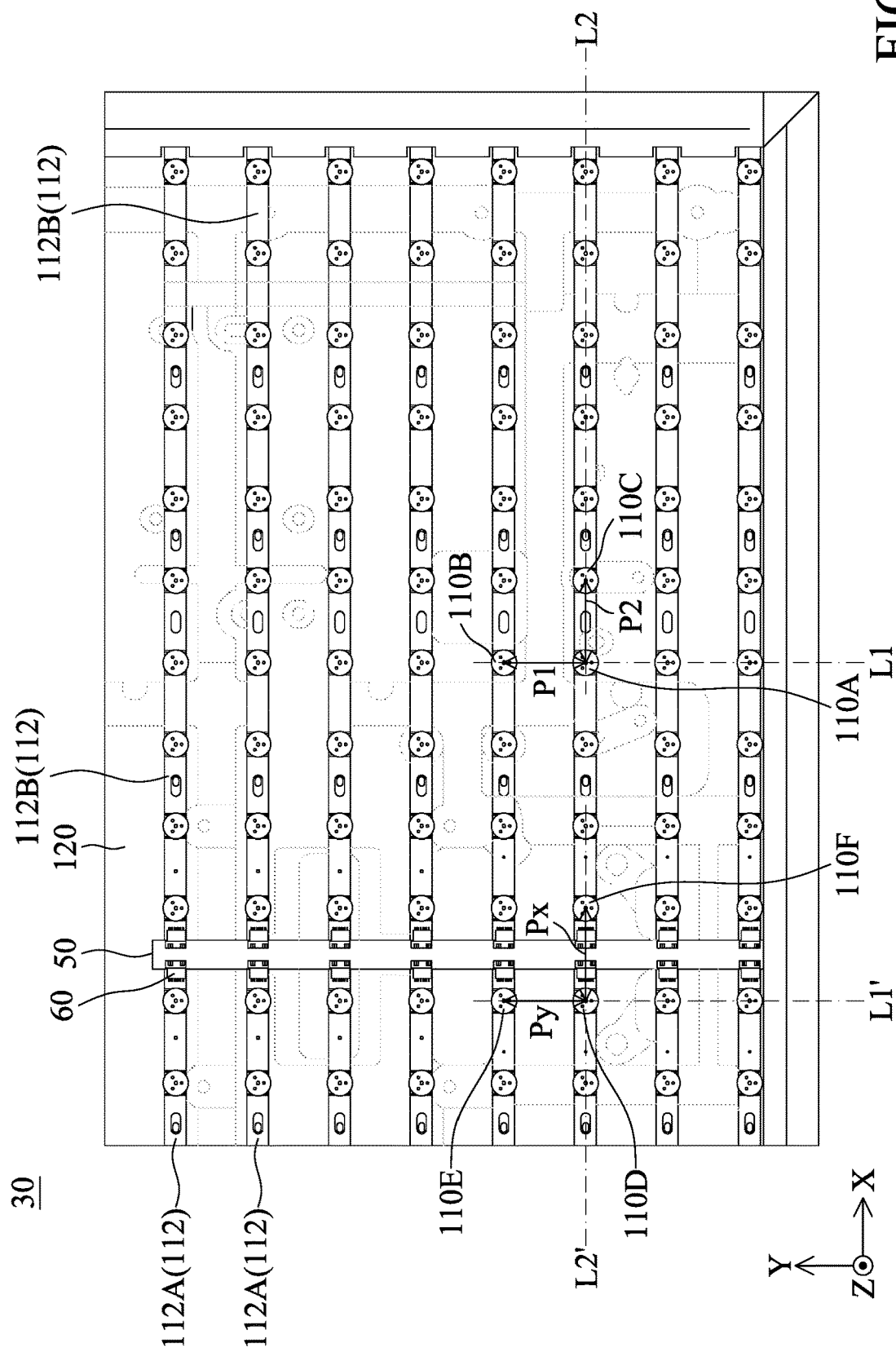
FIG. 8 is a top view illustrating the light-emitting module in accordance with some embodiments of the present disclosure.

FIG. 8 is a top view illustrating the electronic device 30 in accordance with some embodiments of the present disclosure. It is noted that the electronic device 30 shown in the present embodiment may include the same or similar elements and/or portions as the electronic device 10 shown in FIG. 1. These elements and/or portions will be denoted as the same numerals and will not be discussed in detail again. As shown in FIG. 8, the circuit substrate 112 may be disposed on the backplate 120, the circuit substrate 112 may include a plurality of sub-circuit substrates 112A and a plurality of sub-circuit substrates 112B, the sub-circuit substrates 112A may be arranged along the second direction Y, and the sub-circuit substrates 112B may be arranged along the second direction Y. In some embodiments, the plurality of sub-circuit substrates (such as the sub-circuit substrates 112A and the sub-circuit substrates 112B) are electrically connected to each other via a connection structure 50. For example, one of the sub-circuit substrates 112A may electrically connected to one of the sub-circuit substrates 112B via a connection structure 50, but it is not limited thereto. In some embodiments, the extending direction of the connection structure 50 may be substantially perpendicular to the extending direction of the sub-circuit substrates 112A and/or the sub-circuit substrates 112B, but it is not limited thereto. In some embodiments, a reflection layer (not separately illustrated) may be disposed on the connection structure 50.

In the present embodiment, the first light-emitting element 110A, the second light-emitting element 110B, and the third light-emitting element 110C may be selected, and another plurality of light-emitting elements (including a first light-emitting element 110D, a second light-emitting element 110E, and a third light-emitting element 110F) may also be selected. As shown in FIG. 8, the first light-emitting element 110D, the second light-emitting element 110E, and the third light-emitting element 110F may be closer to the connection structure 50 than the first light-emitting element 110A, the second light-emitting element 110B, and the third light-emitting element 110C. In addition, the connection structure 50 is disposed between the first light-emitting element 110D and the third light-emitting element 110F. In the present embodiment, a pitch P1 may be between the first light-emitting element 110A and the second light-emitting element 110B along the first virtual line L1, and a pitch Py may be between the first light-emitting element 110D and the second light-emitting element 110E along the first virtual line L1', and the extending direction of the first virtual line L1 may be approximately parallel to the extending direction of the first virtual line L1'. In some embodiments, the pitch P1 and the pitch Py may satisfy the following relation: $0.7 \leq$ the pitch P1/the pitch Py$\leq 1.3$, but it is not limited thereto. In some embodiments, the pitch P1 and the pitch Py may satisfy the following relation: $0.75 \leq$ the pitch P1/the pitch Py$\leq 1.25$. In some embodiments, the pitch P1 and the pitch Py may satisfy the following relation: $0.8 \leq$ the pitch P1/the pitch Py$\leq 1.2$. In some embodiments, the pitch P1 may be substantially equal to the pitch Py, but it is not limited thereto.

Similarly, a pitch P2 may be between the first light-emitting element 110A and the third light-emitting element 110C along the second virtual line L2, and a pitch Px may be between the first light-emitting element 110D and the third light-emitting element 110E along the second virtual line L2', and the extending direction of the second virtual line L2 may be approximately parallel to the extending direction of the second virtual line L2'. In some embodiments, the pitch P2 and the pitch Px may satisfy the following relation: $0.7 \leq$ the pitch P2/the pitch Px$\leq 1.3$, but it is not limited thereto. In some embodiments, the pitch P2 and the pitch Px may satisfy the following relation: $0.75 \leq$ the pitch P2/the pitch Px$\leq 1.25$. In some embodiments, the pitch P2 and the pitch Px may satisfy the following relation: $0.8 \leq$ the pitch P2/the pitch Px$\leq 1.2$. In some embodiments, the pitch P2 may be substantially equal to the pitch Px, but it is not limited thereto. As set forth above, the connection structure 50 would not significantly affect the pitch between the adjacent ones of the light-emitting elements, the display performance of the electronic device 30 may be uniform.

Figure 9:
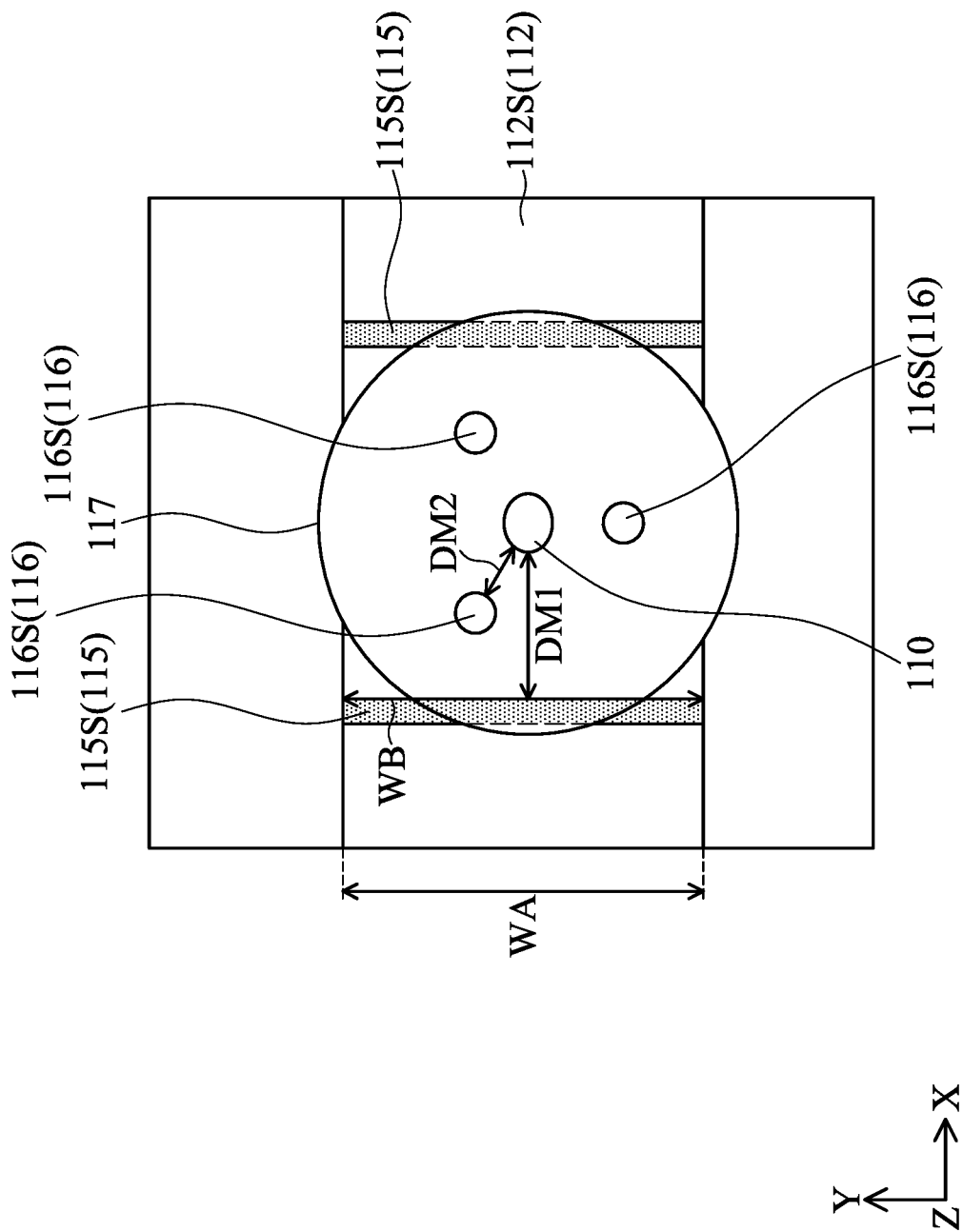
FIG. 9 is a top view illustrating the light-emitting element in accordance with some embodiments of the present disclosure.

FIG. 9 is a top view illustrating the light-emitting element in accordance with some embodiments of the present disclosure. It is noted that, the light-emitting element shown in the present embodiment may include the same or similar elements and/or portions as the light-emitting element shown in FIG. 4. These elements and/or portions will be denoted as the same numerals and will not be discussed in detail again. As shown in FIG. 9, one of the optical pattern 115 may include two sub-patterns 115S, and the two sub-patterns 115S may are located on two opposite sides of the corresponding light-emitting element 110. In some embodiments, the light-emitting element 110 may be disposed between two sub-patterns 115S in the first direction X, but it is not limited thereto. In other embodiments (not shown), the light-emitting element 110 may be disposed between two sub-patterns 115S in the second direction Y, but it is not limited thereto.

In some embodiments, the sub-pattern 115S may be in an elongated shape or other suitable shape, but it is not limited thereto. In some embodiments, the sub-pattern 115S may be substantially parallel to each other, but it is not limited thereto. In some embodiments, in a direction perpendicular to the extending direction of the circuit substrate 112S of the circuit substrate 112 (such as the second direction Y), the width WA of the sub-pattern 115s may be same as the width WB of the sub-pattern 115S. In some embodiments, part of the optical pattern 115 may be not covered by the lens 117. In some embodiments, the adhesive 116 may include a plurality of sub-pattern 116S. In some embodiments, the sub-pattern 116S of the adhesive 116 may be disposed around the light-emitting element 110. In some embodiments, the sub-pattern 116S of the adhesive 116 may be arranged to constitute a triangle, the design can improve the stability of the lens, but it is not limited thereto. In other embodiments, the sub-pattern 115S of the optical patterns 115 may be arranged to constitute a triangle.

In some embodiments, a minimum distance DM1 between one of the sub-patterns 115S of the optical pattern 115 and the light-emitting element 110 may be different from a minimum distance DM2 between one of the sub-patterns 116S of the adhesive 116 and the light-emitting element 110. In some embodiments, the minimum distance DM1 between one of the sub-pattern 115S of the optical pattern 115 and the light-emitting element 110 may greater than the minimum distance DM2 between one of the sub-patterns 116S of the adhesive 116 and the light-emitting element 110.

Figure 10:
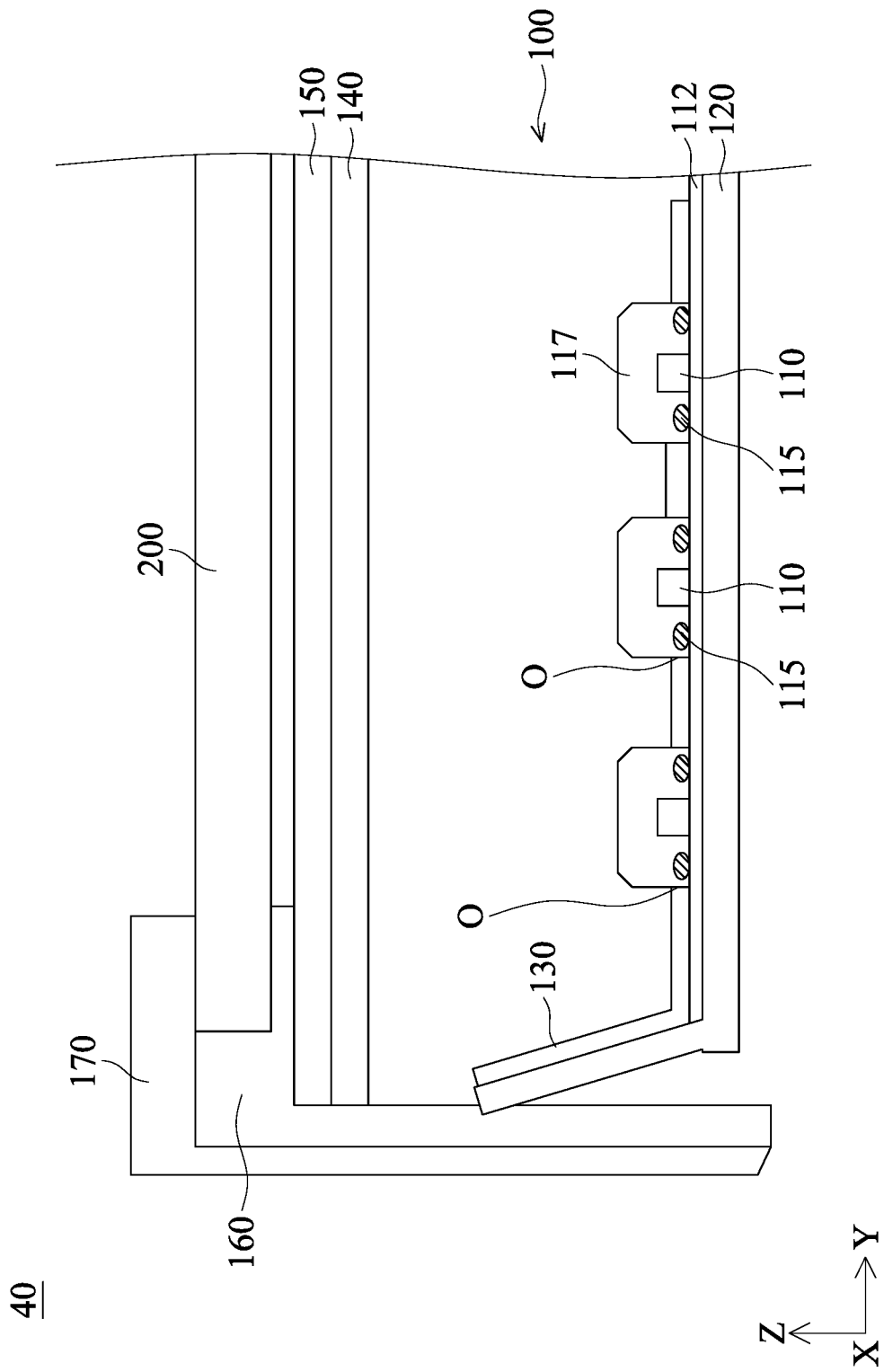
FIG. 10 is a cross-sectional view illustrating an electronic device in accordance with some embodiments of the present disclosure.

FIG. 10 is a cross-sectional view illustrating an electronic device 40 in accordance with some embodiments of the present disclosure. It is noted that the electronic device 40 shown in the present embodiment may include the same or similar elements and/or portions as the electronic device 10 shown in FIG. 1. These elements and/or portions will be denoted as the same numerals and will not be discussed in detail again. For example, the electronic device 40 may include a light-emitting module 100 and a panel 200 disposed on the light-emitting module 100. The light-emitting module 100 may include a circuit substrate 112 and a plurality of light-emitting elements 110 disposed on the circuit substrate 112. In addition, the light-emitting module 100 may include a backplate 120, a reflection element 130, a diffuser 140, and/or at least one optical film 150, but it is not limited thereto.

In some embodiments (FIG. 10), the light-emitting element 110 may be configured to emit a white light, and the optical pattern 115 may include a light-absorbing material, but it is not limited thereto. Since the optical pattern 115 may be configured to absorb the emitted light of the light-emitting element, the brightness difference (for example, mura) between adjacent light-emitting elements may be reduced. For example, the optical pattern 115 may include black material, such as black photoresist, black resin, black ink or combination of the above, but it is not limited thereto. In other embodiments, the light-emitting elements 110 may be configured to emit the light of any other color, and the effect of reducing the brightness difference (for example, mura) between adjacent light-emitting elements may also be achieved.

Figure 11:
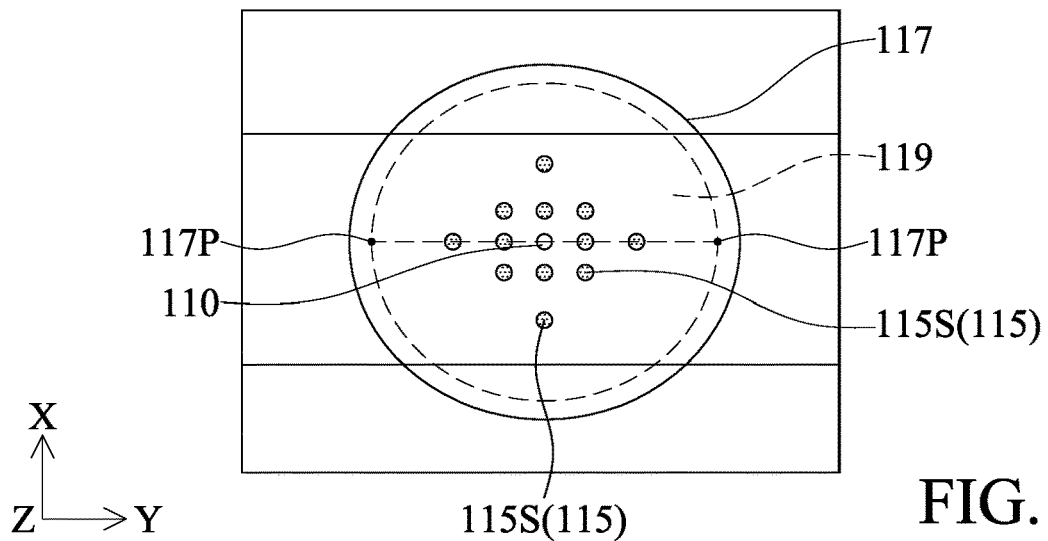
FIG. 11 is a top view illustrating the light-emitting element in accordance with some embodiments of the present disclosure.

FIG. 11 is a top view illustrating the light-emitting element in accordance with some embodiments of the present disclosure. It is noted that the light-emitting element shown in the present embodiment may include the same or similar elements and/or portions as the light-emitting element shown in FIG. 4. These elements and/or portions will be denoted as the same numerals and will not be discussed in detail again. As shown in FIG. 11, the lens 117 may have a recess 119 (surrounded by a dotted line), and the optical pattern 115 may overlap the recess 119 in the normal direction Z of the circuit substrate 112. The recesses 119 may have peaks (i.e. the highest point) in a cross-section view (not shown), and the recesses 119 be defined by a region between a peak 117P in the right-side of the lens 117 and the peak 117P on the left side of the lens 117. As shown in FIG. 11, the optical pattern 115 may include a plurality of sub-patterns 115S. In some embodiments, the sub-patterns 115S may be around the light-emitting element 110 and/or arranged in a symmetrical manner. Accordingly, the brightness difference (for example, mura) between adjacent light-emitting elements may be reduced uniformly, or enhancing the performance of the light-emitting module.

Figure 12:
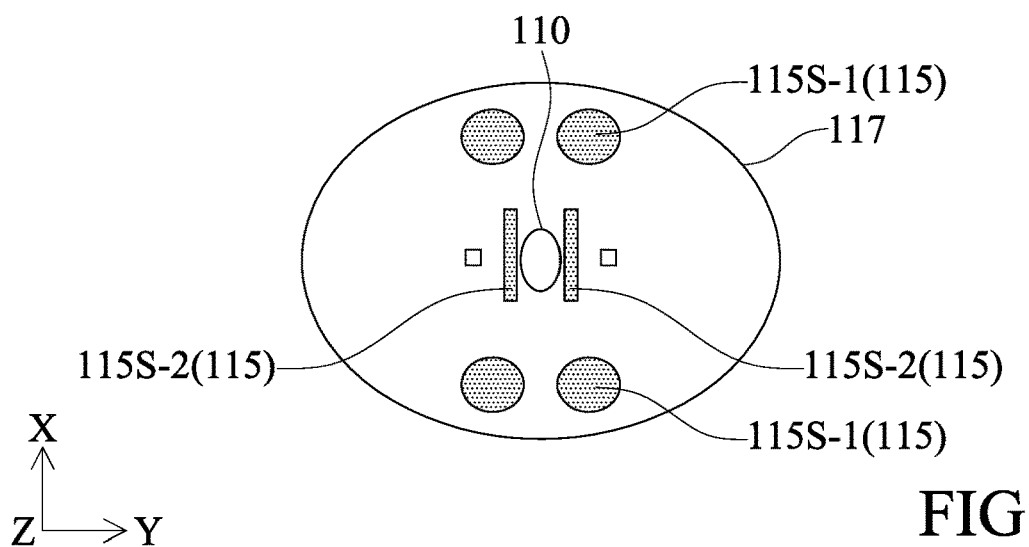
FIG. 12 is a top view illustrating the light-emitting element in accordance with some embodiments of the present disclosure.

FIG. 12 is a top view illustrating the light-emitting element in accordance with some embodiments of the present disclosure. It is noted that the light-emitting element shown in the present embodiment may include the same or similar elements and/or portions as the light-emitting element shown in FIG. 4. These elements and/or portions will be denoted as the same numerals and will not be discussed in detail again. As shown in FIG. 12, the optical pattern 115 may include a plurality of sub-patterns (such as the sub-pattern 115S-1 or the sub-pattern 115S-2). In some embodiments, the shape of the sub-pattern 115S-1 may be different from the shape of the sub-pattern 115S-2. For example, the shape of the sub-pattern 115S-1 and/or the shape of the sub-pattern 115S-2 may be in a rectangular shape, circular shape, a regular shape or an irregular shape. It is noted that the configuration of the optical pattern 115 shown in the present embodiment serves as an example, those skilled in the art would adjust the size, position and/or shape of the optical pattern 115 based on the present disclosure.

Figure 13:
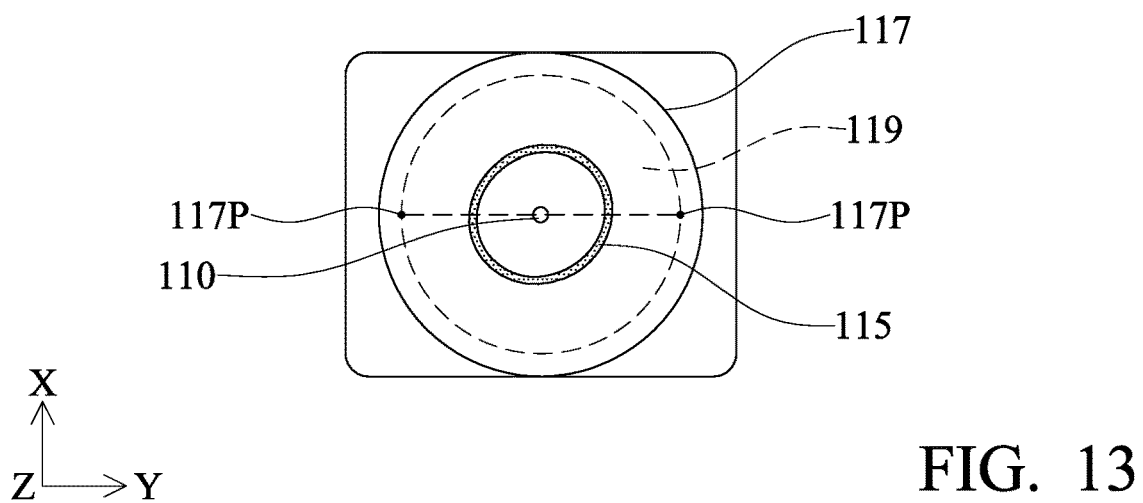
FIG. 13 is a top view illustrating the light-emitting element in accordance with some embodiments of the present disclosure.

FIG. 13 is a top view illustrating the light-emitting element in accordance with some embodiments of the present disclosure. It is noted that the light-emitting element shown in the present embodiment may include the same or similar elements and/or portions as the light-emitting element shown in FIG. 11. These elements and/or portions will be denoted as the same numerals and will not be discussed in detail again. As shown in FIG. 13, the lens 117 may have a recess 119, the definition of the recess 119 can refer to the above. In the present embodiment, the optical pattern 115 may be in a ring shape and surround the light-emitting element 110. In some embodiment, the optical pattern 115 may overlap the recess 119 in a normal direction Z of the circuit substrate 112.

As set forth above, the embodiments of the present disclosure provide a light-emitting module and an electronic device including a lens, the lens may cover the light-emitting element 110 and/or the optical pattern 115. In some embodiments, the optical pattern 115 may include color conversion patterns, the optical pattern 115 may convert the emitting light emitted by the light-emitting element. Accordingly, the brightness difference (for example, mura) between adjacent light-emitting elements may be reduced, and/or the color band (such as blue band) around the light-emitting elements may be reduced. In some embodiments, the optical pattern may include a light-absorbing material configured to absorb the emitting light emitted by the light-emitting element, and the brightness difference (for example, mura) between adjacent light-emitting elements may be reduced. In addition, the optical pattern may be arranged in a symmetrical manner. As such, the brightness difference (for example, mura) between adjacent light-emitting elements may be reduced uniformly, or enhancing the performance of the light-emitting module.

While the embodiments and the advantages of the present disclosure have been described above, it should be understood that those skilled in the art may make various changes, substitutions, and alterations to the present disclosure without departing from the spirit and scope of the present disclosure. It should be noted that different embodiments may be arbitrarily combined as other embodiments as long as the combination conforms to the spirit of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. A light-emitting module, comprising:
a circuit substrate;
a first light-emitting element and a second light-emitting element disposed on the circuit substrate;
an adhesive disposed on the circuit board and having a plurality of sub-patterns;
an optical pattern disposed on the circuit substrate and adjacent to the first light-emitting element, wherein the optical pattern has a plurality of sub-patterns surrounding the first light-emitting element, and in a top view of the light-emitting module, at least two of the plurality of sub-patterns of the adhesive are located between two adjacent ones of the plurality of sub-patterns of the optical pattern; and
a lens covering the first light-emitting element, the adhesive and the optical pattern,
wherein a first virtual line, a second virtual line, and a third virtual line pass through a center of the first light-emitting element, the first light-emitting element and the second light-emitting element are arranged along the first virtual line, an angle is formed between the first virtual line and the second virtual line, and the second virtual line and the third virtual line are perpendicular,
wherein a part of the circuit substrate is divided by the second virtual line and the third virtual line into a first region and a second region, the first virtual line passes through the first region, and the first virtual line does not pass through the second region, and
wherein the optical pattern has a first total area located in the first region and a second total area located in the second region, and the first total area and the second total area are different.

2. The light-emitting module as claimed in claim 1, wherein the first total area is greater than the second total area.

3. The light-emitting module as claimed in claim 1, wherein the first region comprises a first sub-region and a second sub-region, wherein an area of the optical pattern located in the first sub-region is equal to an area of the optical pattern located in the second sub-region.

4. The light-emitting module as claimed in claim 1, wherein the first light-emitting element is configured to emit blue light.

5. The light-emitting module as claimed in claim 4, wherein the optical pattern is yellow.

6. The light-emitting module as claimed in claim 1, wherein the angle formed between the first virtual line and the second virtual line is 45 degrees.

7. An electronic device, comprising:
a light-emitting module, comprising:
a circuit substrate;
a first light-emitting element and a second light-emitting element disposed on the circuit substrate;
an adhesive disposed on the circuit substrate and having a plurality of sub-patterns;
an optical pattern disposed on the circuit substrate and adjacent to the first light-emitting element, wherein the optical pattern has a plurality of sub-patterns surrounding the first light-emitting element, and in a top view of the light-emitting module, at least two of the plurality of sub-patterns of the adhesive are located between two adjacent ones of the plurality of sub-patterns of the optical pattern; and
a lens covering the first light-emitting element, the adhesive and the optical pattern,
wherein a first virtual line, a second virtual line, and a third virtual line pass through a center of the first light-emitting element, the first light-emitting element and the second light-emitting element are arranged along the first virtual line, an angle is formed between the first virtual line and the second virtual line, and the second virtual line and the third virtual line are perpendicular,
wherein a part of the circuit substrate is divided by the second virtual line and the third virtual line into a first region and a second region, the first virtual line passes through the first region, and the first virtual line does not pass through the second region, and
wherein the optical pattern has a first total area located in the first region and a second total area located in the second region, and the first total area and the second total area are different.

8. The electronic device as claimed in claim 7, wherein the first total area is greater than the second total area.

9. The electronic device as claimed in claim 7, wherein the first region comprises a first sub-region and a second sub-region, wherein an area of the optical pattern located in the first sub-region is equal to an area of the optical pattern located in the second sub-region.

10. The electronic device as claimed in claim 7, wherein the first light-emitting element is configured to emit blue light.

11. The electronic device as claimed in claim 10, wherein the optical pattern is yellow.

12. The electronic device as claimed in claim 7, wherein the angle formed between the first virtual line and the second virtual line is 45 degrees.

13. The electronic device as claimed in claim 7, comprising a liquid crystal panel disposed on the light-emitting module.

\* \* \* \* \*